United States Patent [19]

Uskali

[11] Patent Number: 5,648,717
[45] Date of Patent: Jul. 15, 1997

[54] BATTERY CHARGE GAUGE WITH CURRENT INTEGRATOR AND METHOD FOR GUAGING BATTERY CHARGE

[75] Inventor: Bob Uskali, Schaumburg, Ill.

[73] Assignee: Motorola, Inc., Schaumburg, Ill.

[21] Appl. No.: 577,402

[22] Filed: Dec. 22, 1995

[51] Int. Cl.⁶ .......................... H01M 10/44; H01M 10/46
[52] U.S. Cl. ............................................. 320/43; 320/48
[58] Field of Search ................................... 320/5, 21, 30, 320/39, 43, 44, 48; 340/635, 636; 429/61, 90

[56] References Cited

U.S. PATENT DOCUMENTS

| | | | |
|---|---|---|---|
| 3,778,702 | 12/1973 | Finger | 320/48 X |
| 4,377,787 | 3/1983 | Kikuoka et al. | |
| 4,387,334 | 6/1983 | Loper | 320/44 |
| 4,390,841 | 6/1983 | Martin et al. | |
| 4,455,523 | 6/1984 | Koenck | 320/43 |
| 4,525,055 | 6/1985 | Yokoo | 320/48 X |
| 4,553,081 | 11/1985 | Koenck | 320/43 |
| 4,638,237 | 1/1987 | Fernandez | 320/48 X |
| 4,677,363 | 6/1987 | Kopmann | 320/48 X |
| 4,709,202 | 11/1987 | Koenck | 320/43 |
| 4,724,528 | 2/1988 | Eaton | 320/43 X |
| 4,845,419 | 7/1989 | Hacker | 320/39 |
| 4,914,393 | 4/1990 | Yoshido | 320/48 X |
| 5,032,825 | 7/1991 | Kuznicki | 320/48 X |
| 5,043,651 | 8/1991 | Tamura | 320/43 |
| 5,065,084 | 11/1991 | Oogita | 320/48 |
| 5,115,182 | 5/1992 | Ehmke et al. | 320/14 |
| 5,130,659 | 7/1992 | Sloan | 320/48 X |
| 5,144,218 | 9/1992 | Bosscha | 320/44 |
| 5,164,761 | 11/1992 | Isono . | |
| 5,229,704 | 7/1993 | Knepper | 320/2 |
| 5,248,929 | 9/1993 | Burke | 320/48 |

Primary Examiner—Edward Tso
Attorney, Agent, or Firm—Kevin A. Buford

[57] ABSTRACT

A method for gauging battery charge in which current flowing from a battery (11) is integrated (25) and a charge counter counts charge. Voltage (Vb) across the battery is measured (16) and compared (26) with a voltage threshold (28). The counter (27) is reset to a predetermined value (29) when the measured voltage crosses the voltage threshold.

6 Claims, 2 Drawing Sheets

5,648,717

BATTERY CHARGE GAUGE WITH CURRENT INTEGRATOR AND METHOD FOR GUAGING BATTERY CHARGE

FIELD OF THE INVENTION

This invention relates to a battery charge gauge and method for determining existing charge on a battery, for example, a rechargeable battery.

BACKGROUND OF THE INVENTION

Many schemes currently exist in battery powered equipment for the equipment to provide an indication of a battery level to a user during operations. Such schemes include simple measuring of battery terminal voltage. Such arrangements are not very satisfactory because a typical rechargeable battery, e.g. a nickel-cadmium battery, does not exhibit very great voltage changes over a wide range of charging levels.

Better schemes use a current integration technique to integrate currently flowing from and to the battery and to count up and count down a charge value indicative of charge remaining on the battery. A problem with current integration is keeping track of remaining battery capacity, such that inaccuracies in the integration can accumulate in counting up, and counting down, so as to lead to large errors over time. Also it is a problem that a low battery indication can be given too soon or too late.

There is a need for an improved battery gauge and method for gauging battery charge.

A preferred embodiment of the present invention is now described, by way of example only, with reference to the drawings.

DESCRIPTION OF A PREFERRED EMBODIMENT

Figure 1:
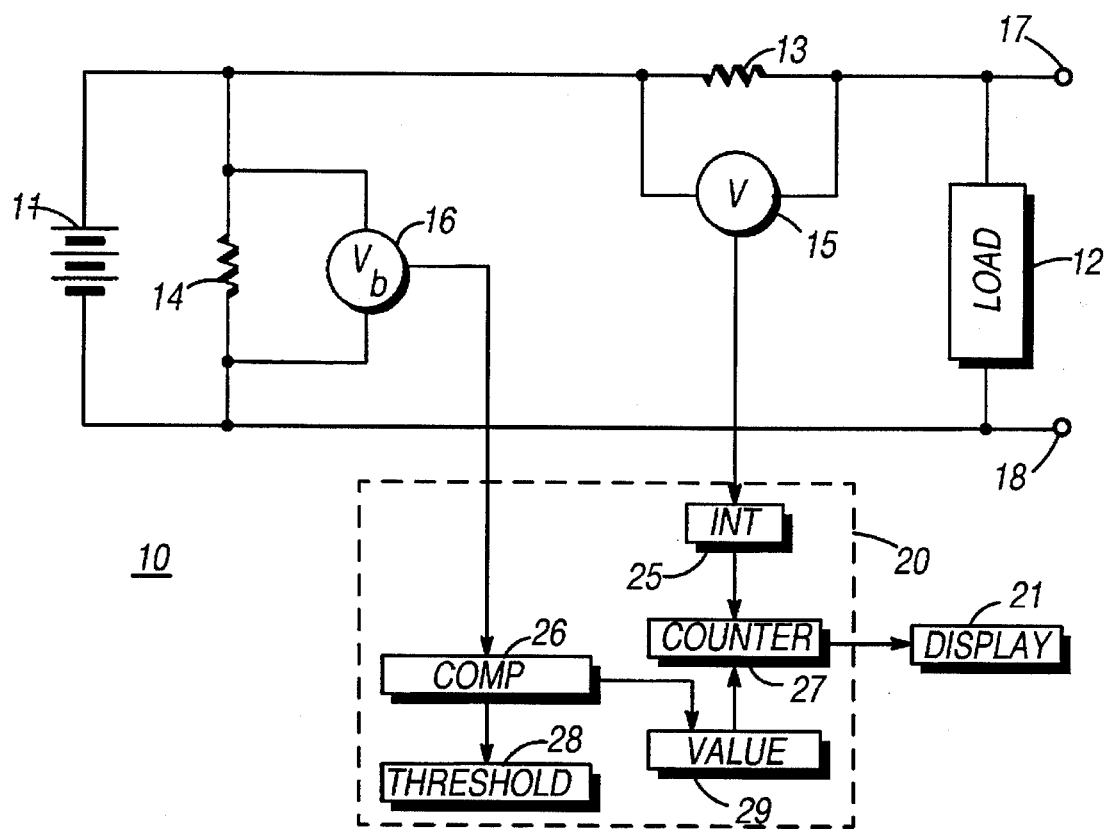
FIG. 1 shows a battery powered device with a battery charge gauge in accordance with the present invention

Referring to FIG. 1, a battery powered device 10 is shown comprising a rechargeable battery 11 connected to a load 12 via a current sensing resistor 13. The load 12 represents a variety of battery powered devices, such as a portable data terminal or a radio or a portable computer. Current sensing resistor 13 is a low value resistor compared with the resistive effect of the load 12. Extending across the terminals of battery 11 is a voltage sensing resistor 14, which is high in comparison with load 12. Connected across current sensing resistor 13 is a first voltage measuring element 15 and connected across voltage sensing resistor 14 is a second voltage measuring element 16. Voltage measuring elements 15 and 16 are connected to a microprocessor 20. A pair of charging terminals 17 and 18 are provided at opposite sides of the load 12.

In the preferred embodiment, the function of first voltage measuring element 15 and current sensing resistor 13 is replaced by a software routine which employs predetermined current values for different functions within the load 12 and which adds the different current values for functions which are operative over any given period of time. The sum of the different current values integrated over the time during which the respective functions are operative gives the total charge drawn from the battery. A suitable routine is described in U.S. Pat. No. 5,115,182 assigned to Motorola, Inc., which patent is incorporated herein by reference.

In the embodiment illustrated in FIG. 1, voltage measuring elements 15 and 16 are merely analog-to-digital converters within the microprocessor 20 and microprocessor 20 is subsumed within the load 12 of the device 10. Connected to the microprocessor 20 is a display 21, also forming part of the load 12.

It will be appreciated that the elements described above can be arranged in alternative arrangements. For example, voltage sensing resistor 14 is not essential and voltage measuring element 16 can be connected directly across load 12. Also, current sensing resistor 13 can be an element within load 12. Also, there may be a voltage regulator connected between the battery 11 and the load 12.

Microprocessor 20 implements a number of elements in software. Included in the software in microprocessor 20 are an integrator 25, a comparator 26, a counter 27, a threshold storage element 28, and a value storage element 29.

The operation of the device is as follows. When the device is powered up and the load 12 draws current from the battery 11, first voltage measuring element 15 provides a value to integrator 25. At frequent regular intervals of time, integrator 25 adds the values supplied by first voltage measuring element 15. In this manner, integrator 25 integrates the current flowing through current sensing resistor 13. While the load 12 is drawing current, voltage measuring element 15 indicates current (rate of flow of charge) flowing out of the battery 11 and, subject to certain conditions described below, integrator 25 causes counter 27 to count down from its present value.

When the user wishes to recharge battery 11, a battery charger is connected to terminals 17 and 18 and current flows in the opposite direction through resistor 13. During charging of battery 11, voltage measuring element 15 indicates current flowing in the opposite direction and integrator 25 causes counter 27 to count up from its present value (subject again to conditions described below).

Figure 2:
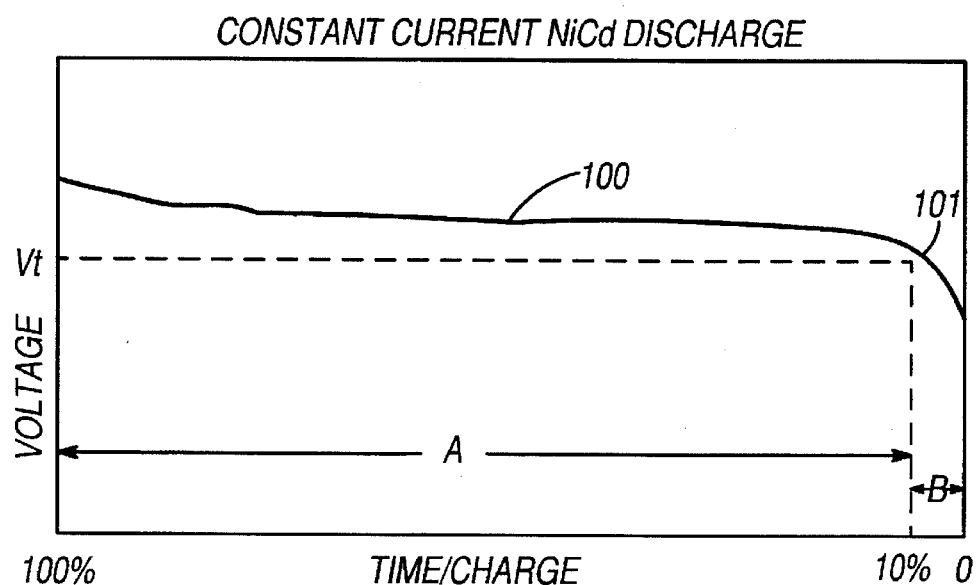
FIG. 2 shows a typical battery voltage/time or charge characteristic for a nickel-cadmium battery during constant current discharge.

FIG. 2 shows a typical voltage/time (or voltage/charge) characteristic for a nickel-cadmium battery discharging with constant current. The characteristic has a substantially flat region A extending from maximum charge on the left hand side for a major portion of the battery charge, where battery charge is relatively high. It also has a rapidly falling region B in a minor portion of battery charge, where battery charge is relatively low. The major portion of battery charge is represented by the area beneath the characteristic 100 from 100% charge on the left hand side to an elbow 101 in the characteristic at a predetermined charge level of approximately 10% of maximum battery charge. The minor portion of battery charge is represented by the area under the graph from the elbow 101 to the right hand side, where the remaining battery charge is virtually zero.

The battery voltage is monitored by second voltage measuring element 16, which in the preferred embodiment provides another signal to another digital-to-analog converter in processor 20. Comparator 26 compares the measured voltage from voltage measuring element 16 with a threshold voltage Vt from threshold memory element 28, where the value of Vt is stored in memory. When the measured voltage from voltage measuring element 16 crosses the threshold Vt, this is indicative of the voltage on battery 11 passing from the major portion of battery charge A to the minor portion of battery charge B, or vice versa, depending on whether the battery is charging or discharging. Comparator 26 is able to provide a signal when the voltage delivered by the battery 11 passes the elbow 101 in the characteristic 100.

The signal provided by comparator 26 is provided to counter resetting element 29, where a predetermined value is stored. The predetermined value stored in counter resetting element 29 is representative of the charge remaining in the battery when the voltage is at the predetermined voltage Vt. Counter 27 is selectively reset using the value stored in counter resetting element 29, according to an algorithm described below.

In effect, the value stored in counter resetting element 29 overrides the value currently stored in counter 27 when the value in counter 27 is greater than 10% but the battery voltage Vb measured by second voltage measuring element 16 is less then Vt, or the value in counter resetting element 29 overrides the value stored in counter 27 when the value in counter 27 is less than 10% of the maximum battery charge and Vb is greater than or equal to Vt. If the value stored in counter 27 is less than or equal to 10% of maximum battery charge and Vb is greater than or equal to Vt then the presumed value stored in counter resetting element 29 is similarly passed to counter 27 to override the existing value in counter 27.

At any time the value in counter 27 can be displayed on display 21 to indicate to the user the existing battery level. This indication can be given in the form of a bar display presented on a liquid crystal display. Other forms of displaying the battery level can be used, as are known in the art.

Figure 3:
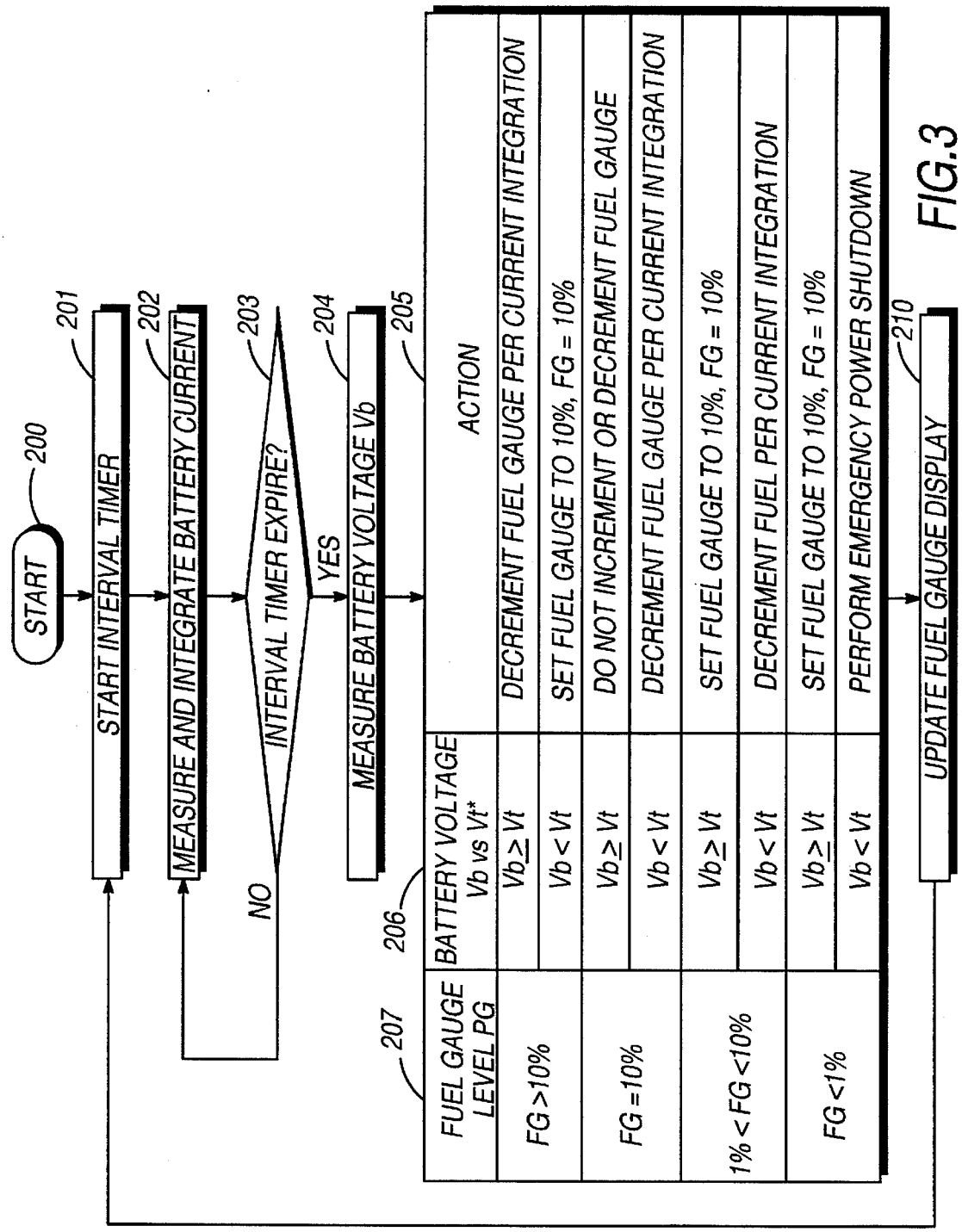
FIG. 3 is a flow diagram illustrating steps performed by the battery charge gauge of FIG. 1.

Referring now to FIG. 3, details of the algorithm performed by processor 20 of FIG. 1 are shown. Following from a start-up state 200, a continuous loop is executed starting from step 201, where an interval timer is started. In step 202, integrator 25 integrates the battery current measured by first voltage measuring element 15. After expiration of an integration time set by step 203, the battery voltage Vb is measured by comparator 26 measuring the battery voltage from battery measuring element 16. Comparator 26 compares the measured battery voltage Vb with the threshold Vt according to column 206 of table 205. At the same time, the value in counter 27 is compared against a threshold of 10% of maximum battery charge as set out in column 207 of table 205, where the value in counter 27 is referred to as the fuel gauge level (FG). The fuel gauge level (FG) is also compared against a lower threshold of 1% of maximum battery charge. The maximum battery charge is a predetermined value and is in effect a maximum level to which counter 27 counts.

If the fuel gauge level is greater than 10% and Vb is greater than or equal to Vt, no overriding of the value in counter 27 needs to take place and the counter (fuel gauge) is decremented according to the current integration in integrator 25. If the fuel gauge is greater than 10% and Vb is less than Vt, a value of 10% of maximum battery charge is loaded into counter 27 from counter resetting element 29. If the fuel gauge is set at 10% and Vb is greater than or equal to Vt, counter 27 is not incremented or decremented. If the fuel gauge is set at 10% and Vb is less than Vt, counter 27 is decremented according to the current integration performed by integrator 25.

If the fuel gauge value is between 1 and 10% and Vb is greater than or equal to Vt, the fuel gauge is set to 10%. If the fuel gauge is between 1 and 10% and Vb is less than Vt, the fuel gauge is decremented according to the current integration. If the fuel gauge is less than or equal to 1% and Vb is greater than or equal to Vt, the fuel gauge is set to 10%. If the fuel gauge is less than or equal to 1% and Vb is less than Vt, the battery has very little charge remaining, as indicated by both the counter 27 and the voltage measuring element 16 and it is time to perform an emergency power shut down.

In step 210, the display 21 is updated according to the value in the counter 27 and the process starts again at step 201.

In a manner known in the art, the counter 27 can be reset to 100% charge when the battery has been fully recharged.

Alternatively in a manner similar to the manner illustrated in FIG. 3, upon charging up the battery 11, a predetermined value can be loaded into counter 27 when the voltage measured across the battery, as measured by the second voltage since the element 16, crosses a threshold. The charging characteristic is not exactly the same as the discharging characteristic illustrated in FIG. 2, but in a similar manner, a suitable region of rapidly rising battery voltage is identified and a predetermined charge value representative of the charge in that region is stored in counter resetting element 29 and loaded into counter 27 when conditions indicate that the value in the counter 27 is not representative of the actual charge on the battery and the voltage measured across the battery is a better representation of the charge state.

Thus a method has been described for gauging battery charge, the method comprises the steps of: integrating current flowing from (and optionally to) a battery; counting a charge counter (down and optionally up) in response to the step of integrating; measuring voltage across the battery; comparing the measured voltage with a voltage threshold; and resetting the counter to a predetermined value when the measured voltage crosses the voltage threshold.

A battery charge gauge has also been described comprising: a current integrator 25 for integrating current flowing from (and optionally to) a battery 11, a counter 27 (preferably an up and down counter) responsive to the integrator 25 for counting a value representative of the battery charge; a voltage measurement element 16 for measuring voltage across the battery; a comparator 26 for comparing measured voltage with a threshold 28; and a counter resetting element 29 for resetting the counter to a calibration value when the measured voltage crosses the threshold.

What is claimed is:

1. A method for gauging battery charge comprising the steps of:

integrating current flowing from a battery;
   counting a counter in response to the step of integrating;
   measuring voltage across the battery; and
   comparing measured voltage with a voltage threshold and resetting the counter to a predetermined value when the measured voltage crosses the voltage threshold.

2. A method according to claim 1 wherein the battery has a characteristic exhibiting an elbow and the voltage threshold is representative of the elbow in the characteristic.

3. A method according to claim 1 wherein the battery has a voltage-current characteristic for constant current during discharge and wherein the characteristic has a substantially flat region extending from a maximum charge for a major portion of battery charge where battery charge is relatively high and a rapidly falling region in a minor portion of battery charge where battery charge is relatively low and where the voltage threshold is set in the rapidly falling region of the characteristic.

4. A method according to claim 1 wherein the battery has a maximum charge and the predetermined value is set at approximately 10% of maximum charge.

5. A method according to claim 1 comprising the step of comparing the counter with a predetermined charge level and, during battery discharge:

if the counter exceeds the predetermined charge level and the measured voltage falls below the voltage threshold, setting the counter to the predetermined value; else if the counter is below the predetermined charge level and the measured voltage is above the voltage threshold, setting the counter to the predetermined value; else if the counter is below the predetermined charge level and the measured voltage is below the voltage threshold, decrementing the counter in response to the step of integrating.

6. A battery charge gauge comprising:

a current integrator for integrating current flowing from a battery;

a counter responsive to the current integrator for counting a value representative of battery charge;

a voltage measurement element for measuring voltage across the battery to provide a measured voltage;

a comparator for comparing the measured voltage with a threshold; and a counter resetting element for resetting the counter to a calibration value when the measured voltage crosses the threshold.

* * * * *